US008298870B2

(12) United States Patent  (10) Patent No.: US 8,298,870 B2
Romig  (45) Date of Patent: Oct. 30, 2012

(54) METHOD FOR CONNECTING INTEGRATED CIRCUIT CHIP TO POWER AND GROUND CIRCUITS

(75) Inventor: Matthew D. Romig, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/955,319

(22) Filed: Nov. 29, 2010

(65) Prior Publication Data
US 2011/0070700 A1 Mar. 24, 2011

Related U.S. Application Data

(62) Division of application No. 11/804,003, filed on May 16, 2007, now Pat. No. 7,863,738.

(51) Int. Cl.
H01L 21/00 (2006.01)
(52) U.S. Cl. ................. 438/123; 257/E21.503
(58) Field of Classification Search ........... 438/123, 438/121, 106–108; 257/672, 675, 920, 707, 257/E39.004, E21.503, E21.507, E21.506, 257/E21.511, E21.512, E21.499
See application file for complete search history.

(56) References Cited

U.S. PATENT DOCUMENTS

| 5,895,967 | A | * | 4/1999 | Stearns et al. | 257/691 |
|---|---|---|---|---|---|
| 5,977,626 | A | * | 11/1999 | Wang et al. | 257/707 |
| 6,291,273 | B1 | | 9/2001 | Miyaki et al. | |
| 6,569,764 | B1 | * | 5/2003 | Hirashima et al. | 438/673 |
| 6,924,548 | B2 | | 8/2005 | Hasebe et al. | |
| 6,963,141 | B2 | | 11/2005 | Lee et al. | |
| 7,005,747 | B2 | | 2/2006 | Koizumi | |
| 7,245,008 | B2 | | 7/2007 | Lee | |
| 7,787,250 | B2 | * | 8/2010 | Li et al. | 361/715 |
| 7,868,472 | B2 | * | 1/2011 | Kelly | 257/796 |
| 7,968,982 | B2 | * | 6/2011 | Wu et al. | 257/675 |
| 2002/0190397 | A1 | | 12/2002 | Kim | |
| 2003/0089983 | A1 | | 5/2003 | Huang et al. | |
| 2003/0090877 | A1 | | 5/2003 | Ochiai et al. | |
| 2004/0080056 | A1 | | 4/2004 | Lim et al. | |

(Continued)

FOREIGN PATENT DOCUMENTS

JP 200714937 1/1995

(Continued)

Primary Examiner — Matthew Landau
Assistant Examiner — Latanya N Crawford
(74) Attorney, Agent, or Firm — Steven A. Shaw; W. James Brady; Frederick J. Telecky, Jr.

(57) ABSTRACT

In a method for transferring at least one of power and ground signal between a die and a package base of a semiconductor device, a connector is formed there between. The connector, which is disposed above the die attached to the package base, includes a center pad electrically coupled to the die by a plurality of conductive bumps and a finger extending outward from the center pad towards the package base. The finger is electrically coupled to the package base by a conductive pad. A plurality of bond wires are formed to electrically couple the package base and the die. A resistance of a conductive path via the connector is much less than a resistance of a conductive path via any one of the plurality of bond wires to facilitate an efficient transfer of the at least one of power and ground signal.

8 Claims, 6 Drawing Sheets

U.S. PATENT DOCUMENTS

| | | | |
|---|---|---|---|
| 2004/0159926 A1* | 8/2004 | Moriwaki | 257/678 |
| 2005/0006785 A1 | 1/2005 | Liu et al. | |
| 2005/0040529 A1 | 2/2005 | Lee | |
| 2006/0202326 A1* | 9/2006 | Huang et al. | 257/718 |
| 2007/0057350 A1* | 3/2007 | Otremba | 257/666 |
| 2007/0108598 A1* | 5/2007 | Zhong et al. | 257/707 |
| 2008/0111230 A1 | 5/2008 | Kim et al. | |
| 2008/0169537 A1 | 7/2008 | Kajiwara et al. | |
| 2009/0294937 A1* | 12/2009 | Edwards | 257/675 |

FOREIGN PATENT DOCUMENTS

| | | |
|---|---|---|
| JP | 2003209216 A | 7/2003 |

* cited by examiner

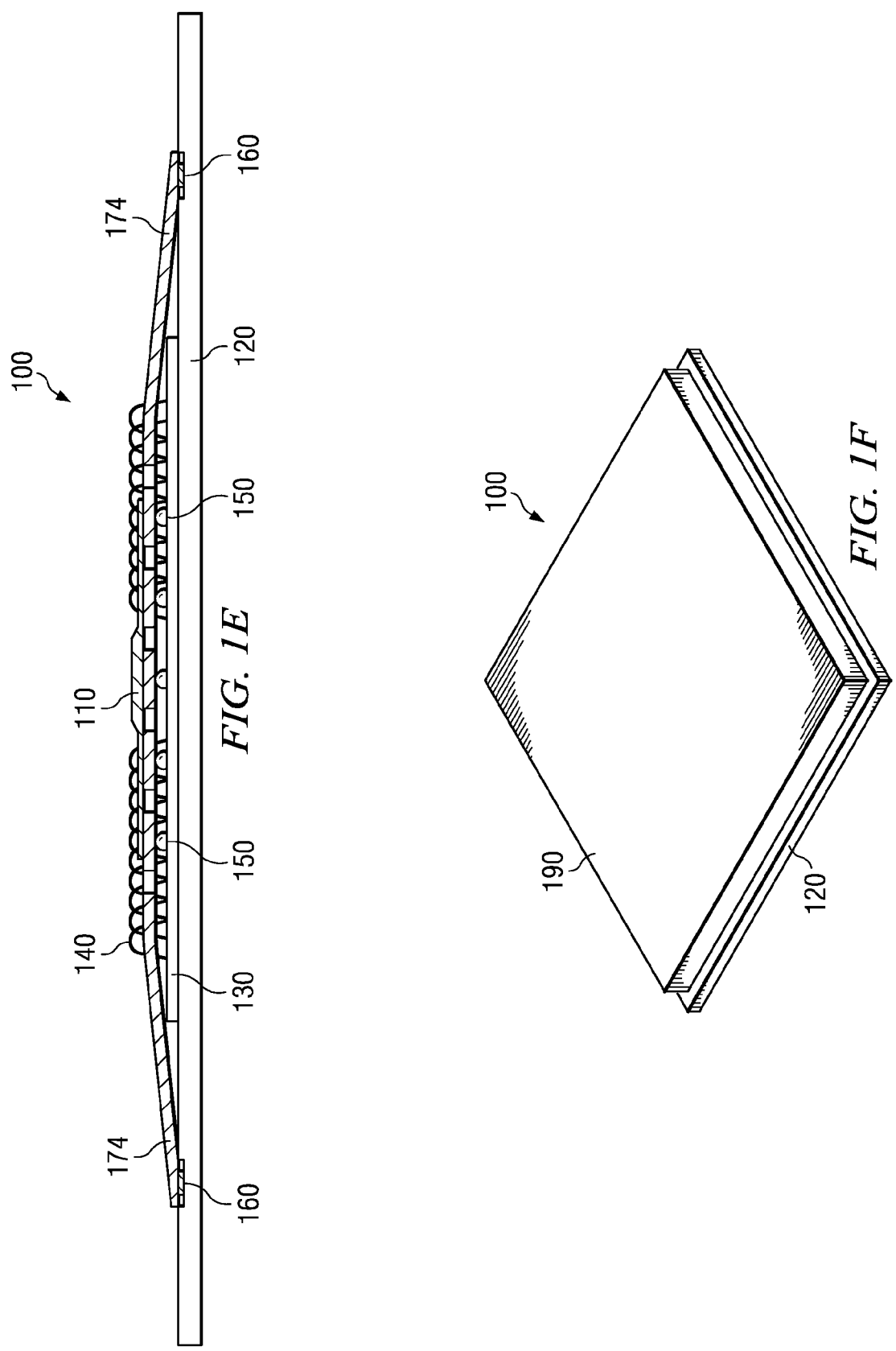

METHOD FOR CONNECTING INTEGRATED CIRCUIT CHIP TO POWER AND GROUND CIRCUITS

This is a divisional of application Ser. No. 11/804,003 filed May 16, 2007, the contents of which are herein incorporated by reference in its entirety.

BACKGROUND

The present invention is related in general to the field of semiconductor device assembly and packaging, and more specifically to providing connections for power or ground in an integrated circuit (IC) package.

It is well known to use thin metallic bond wires for interconnecting a die and an IC package base, including interconnections for carrying, transferring, delivering, or distributing voltage and current signals related to power or ground circuits there between. The IC package base may include a leadframe or a laminate substrate. The use of thin metallic bond wires for carrying power or ground related voltage and current signals may limit the performance and reliability of the IC package. This is particularly true if relatively large currents are switched and delivered to the die in a high-speed manner. For example, presence of a resistance, a capacitance, and an inductance, or a combination thereof, in the bond wires within the IC package may increase voltage (or IR) drop across the bond wires, may limit the current capacity of the IC package, and may increase noise due to cross coupling within the IC package. Additionally, high average current densities may cause undesirable wearing out of the bond wires.

Other well known techniques to interconnect the die and the package base for carrying power or ground related electrical signals there between include the use of flip chip (FC) interconnect, use of thicker gold bond wires, post fabrication use of top aluminum layer on the die or plated thick copper layer, and core or intra-die bonding. However, many of the conventional techniques are often more expensive, complex or are still subjected to the bond wire limitations such as number, manufacturability, density, and thickness.

SUMMARY

Applicant recognizes an existing need for a method and system for fabricating a semiconductor device which provides a direct interconnection between a die and a package base, especially interconnection for carrying power or ground related electrical signals there between, absent the disadvantages found in the prior art techniques discussed above. Applicant also recognizes an existing need for the improved interconnection to provide: 1) a low resistance to reduce a voltage drop, 2) a direct connection to the die to reduce routing on silicon, 3) reduced number of peripheral bond pads for handling power or ground signals to enable die size reduction, and 4) thicker or wider connections to increase current flow.

The foregoing need is addressed by the teachings of the present disclosure, which relates to a system and method for assembly and packaging of semiconductor devices. According to one embodiment, in a method and system for transferring at least one of power and ground signal between a die and a package base of a semiconductor device, a connector is formed there between. The connector, which is disposed above the die attached to the package base, includes a center pad electrically coupled to the die by a plurality of conductive bumps and a finger extending outward from the center pad towards the package base. The finger is electrically coupled to the package base via a conductive pad. A plurality of bond wires are formed to electrically couple the package base and the die. A resistance of a conductive path via the connector is much less than a resistance of a conductive path via any one of the plurality of bond wires to facilitate an efficient transfer of the at least one of power and ground signal.

In one aspect of the disclosure, a method for fabricating a semiconductor device includes placing a plurality of conductive bumps on a surface of a die. The surface of the die opposing the plurality of bumps is attached to a package base, which may be a leadframe or a substrate. A connector is connected to the die and to the package base. The connecting includes electrically coupling a center pad of the connector to the die by the plurality of conductive bumps, and electrically coupling a finger to the package base by a conductive pad. The finger extends outward from the center pad towards the package base. A plurality of bond wires are connected to electrically couple the package base and the die. A resistance of the connector is much less than a resistance of any one of the plurality of bond wires. The die, the connector, and the plurality of bond wires are molded over by a molding compound.

Several advantages are achieved by the method and system according to the illustrative embodiments presented herein. The embodiments advantageously provide an improved connector for transferring at least one of power and ground signal between a die and a package base of a semiconductor device. The improved connector advantageously provides a low resistance conductive path, thereby reducing the IR drop, especially compared to the resistance of the conductive path via the bond wire. The connector, including the finger may be configured to be thicker and wider to decrease the path resistance and increase current flow, and may be extended from other sides of the die to enable optimal connection between desired locations on the die and substrate. The electrical coupling between the connector and the die and the package base advantageously provide a direct connection to the die (via the plurality of conductive bumps) to reduce routing on silicon and also reduce the number of peripheral bond pads for power or ground to enable die size reduction. The connector may be optionally implemented as a multilayer substrate to reduce inductance between the power and ground networks, or as a partitioned metal pattern to enable connection of both power and ground. The connector also advantageously provides improvement in thermal performance by providing an additional high-conductivity path between the die and the substrate.

BRIEF DESCRIPTION OF THE DRAWINGS

FIG. 1E illustrates a simplified and schematic cross sectional view of a semiconductor device described with reference to FIG. 1A, according to an embodiment;

FIG. 1F illustrates a simplified and schematic cross sectional view in perspective of a semiconductor device described with reference to FIG. 1A after assembly, according to an embodiment.

DETAILED DESCRIPTION

Figure 1A:
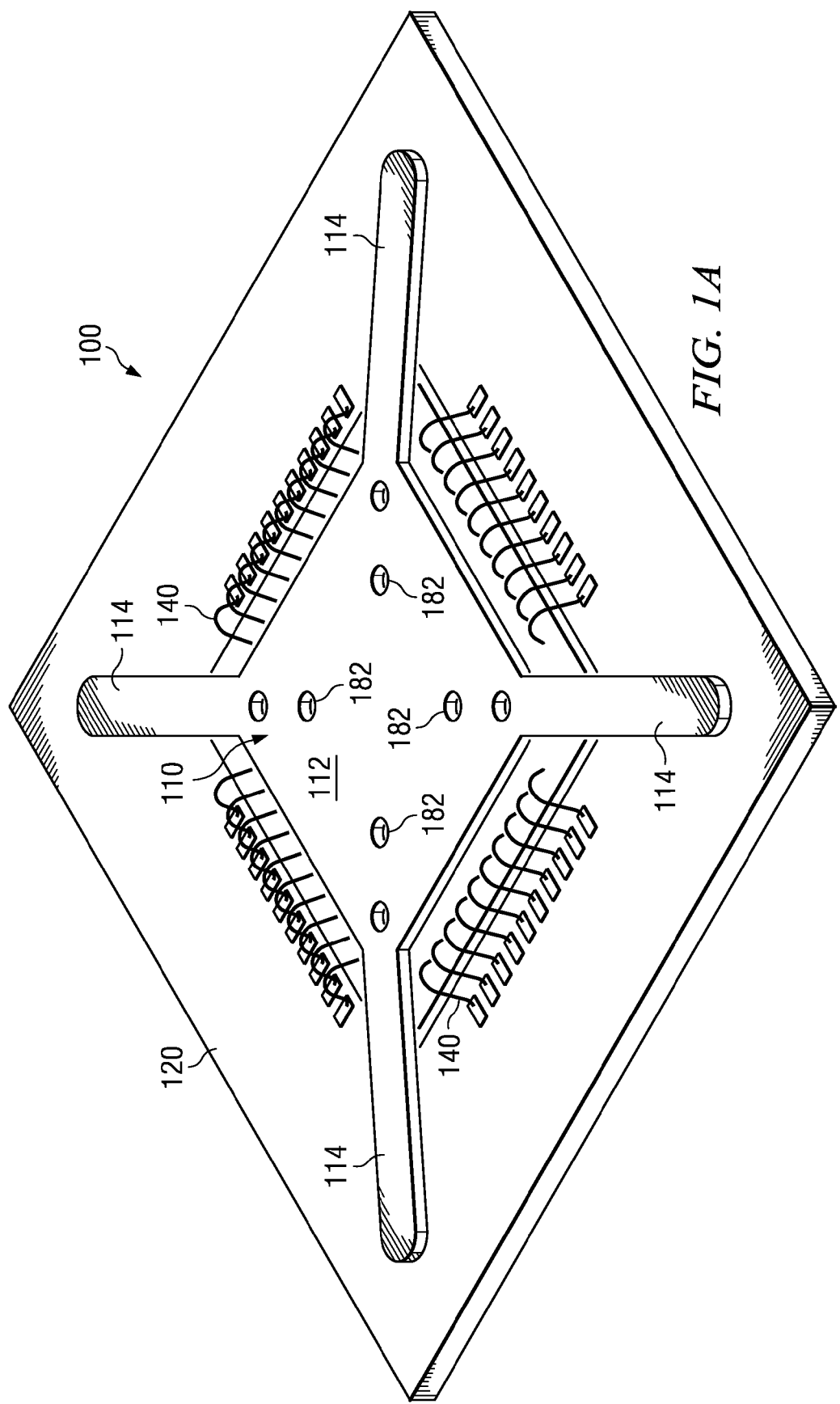
FIG. 1A illustrates a simplified and schematic view in perspective of a semiconductor device having a connector, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Many semiconductor devices use thin metallic bond wires for interconnecting a die and a package base such as a leadframe or a substrate. The interconnections are used for carrying, delivering, or distributing at least one of power and ground signal. However, presence of a resistance, a capacitance, and an inductance, or a combination thereof, in the bond wires used for the interconnection may increase voltage (or IR) drop across the bond wires, may limit the current capacity of the IC package, and may increase noise due to cross coupling within the IC package. These problems, among others, may be addressed by a system and method for fabricating a semiconductor device which provides improved interconnection between a die and a package, especially interconnection for carrying power or ground signals there between. According to an embodiment, in a method and system for transferring at least one of power and ground signal between a die and a package base of a semiconductor device, a connector is formed there between. The connector, which is disposed above the die attached to the package base, includes a center pad electrically coupled to the die by a plurality of conductive bumps and a finger extending outward from the center pad towards the package base. The finger is electrically coupled to the package base by a conductive pad. A plurality of bond wires are formed to electrically couple the package base and the die. A resistance of a conductive path via the connector is much less than a resistance of a conductive path via any one of the plurality of bond wires to facilitate an efficient transfer of the at least one of power and ground signal. The semiconductor device having an improved interconnection structure for transferring at least one of power and ground signals is described with reference to FIGS. 1A, 1B, 1C, 1D, 1E, 1F and FIG. 2.

The following terminology may be useful in understanding the present disclosure. It is to be understood that the terminology described herein is for the purpose of description and should not be regarded as limiting.

Semiconductor Package (or Package)—A semiconductor package provides the physical and electrical interface to at least one integrated circuit (IC) or die for connecting the IC to external circuits. The package protects the IC from damage, contamination, and stress that result from factors such as handling, heating, and cooling. The process of putting the IC inside a package to make it reliable and convenient to use is known as semiconductor package assembly, or simply 'assembly'.

Leadframe—A sheet metal framework upon which an IC chip or die is attached, wirebonded, and transfer molded with epoxy. The leadframe may include leads that are connected by bond wires to the bonding pads of the die to provide electrical connection to external points.

Substrate—A substrate is an underlying material used to fabricate a semiconductor device. In addition to providing base support, substrates are also used to provide electrical interconnections between the IC chip and external circuits. Two categories of substrates that are used to fabricate the semiconductor device include rigid substrates and flexible tape substrates. Rigid substrates are typically composed of a stack of thin layers or laminates, and are often referred to as multilayer laminate substrates. In some applications, the laminate substrate may include a single layer of dielectric material and a single layer of metal. Flexible tape substrates are typically composed of polymer material such as polyimide, and are often referred to as a polyimide tape substrate. The polyimide tape substrate, which typically includes a metal layer, is generally cheaper, thinner and more flexible compared to the multilayer laminate substrate. Interconnecting patterns such as vias provide electrical coupling between the multiple layers of the substrate. The conductive layers typically include traces of a metal foil bonded to a polymer substrate.

Package Base—A package base provides support for the IC chip or die. As described herein, the package base may be selectable from one of a leadframe or a substrate.

Semiconductor Device—A semiconductor device is an electronic component that utilizes electronic properties of semiconductor materials to perform a desired function. A semiconductor device may be manufactured as a single discrete device or as one or more ICs packaged into a module.

Ball grid array (BGA)—A type of chip package type that enables direct mounting of the chip to a substrate or printed circuit board via solder balls or bumps. The solder balls or bumps are arranged in a grid-style array and found on the underside of the chip to make the electrical connection to the outside.

Configuration—Describes a set up of an element, a circuit, a package, an electronic device, and similar other, and refers to a process for setting, defining, or selecting particular properties, parameters, or attributes of the device prior to or during its use or operation. Some configuration attributes may be selected to have a default value. For example, for a particular application, an allowable IR drop from a power source to a die may be configured to be 0.1 volts.

Electrical Connector or Interconnect—A technique to provide electrical coupling between two electrical elements. The electrical interconnect uses conductive materials such as metal (e.g., aluminum, copper, silver, gold, and similar others including alloys), a conductive adhesive, a thermo compression weld, a high melting point solder contact, or a combination thereof to achieve the electrical interconnection. The interconnect, which is an essential part of any semiconductor device, may include conductive traces, conductive bumps, solder bumps, vias, metal planes, bond wires, metal lands, metal planes, bond wire areas, conductive pads, metal studs, and similar others. A conductive bump, as described herein, is a conductive element that may be in the form of a sphere and is included in a conductive path between a die and a substrate. A conductive bump may be formed by applying a reflowable conductive material (such as reflowable solder in a paste, powder, or film form) to a contact pad, e.g., a solder bump. Other materials used to form the conductive bump may include anisotropic or isotropic conductive paste, conductive adhesives, and copper, gold metals or alloys thereof. A conductive bump may also be implemented in the form of a metal stud. In addition, traditional mechanical connection techniques such as spring, socket, and pin, may be used to form the interconnect.

Power and ground signal—A die is electrically coupled to a power supply (or power source) and a voltage reference such as ground through a power and ground circuit. The electrical coupling may be routed via a leadframe or a substrate. Any electrical signal such as a voltage or a current signal that is transferred between the die and the power supply is referred to as a power signal and between the die and the ground is referred to as a ground signal.

FIG. 1A illustrates a simplified and schematic view in perspective of a semiconductor device 100 having connector 110, according to an embodiment. The semiconductor device 100 includes a package base 120, shown as a substrate. In an exemplary, non-depicted embodiment, the package base 120 may be a leadframe. A die 130 is attached to the package base 120 by a die attach compound (not shown). The connector 110, which is disposed above the die 130, provides electrical coupling between the die 130 and the package base 120. Additional details of the electrical coupling is described with reference to FIG. 1B and FIG. 1E.

The connector 110 includes a center pad 112 with one or more extensions such as a finger 114 in one or more pad corners. In the depicted embodiment, the center pad 112 is of a rectangular shape and a center of the center pad 112 is aligned with a center of the die 130. The connector 110 also includes the finger 114 that is elongated and extending outward from the center pad 112 towards a peripheral or corner area of the package base 120. In the depicted embodiment, the connector 110 includes four fingers corresponding to and aligned with the four corners of the die 130 and the four corners of the package base 120. In an exemplary, non-depicted embodiment, the connector 110 may have a different shape and geometry than a rectangle, and may include more or less number of fingers than four. The particular shape and geometry of the center pad 112 and the finger 114 is adaptable as desired to enable optimal connection between desired locations on the die 130 and the package base 120. The particular shape and geometry may be application dependent and may vary on factors such as the die size and the location of bond wires. For example, the fingers 114 may be extended from non-corner areas of the center pad 112 and be coupled to non-corner areas of the package base 120. In the depicted embodiment, the connector 110 may include, as an option, a plurality of holes 182. The plurality of holes 182 advantageously enable a molding compound (not shown) to flow through, thereby forming a secure bond.

A plurality of bond wires 140 electrically couple the package base 120 and the die 130. The plurality of bond wires 140 are preferably configured to carry signals other than the power or ground signals, and the connector 110 is preferably configured to carry the at least one of power and ground signal. Thus, the plurality of bond wires 140 are advantageously freed up to carry a significant portion of the input and output signals, whereas the connector 110 is enabled to carry a significant portion of the power and ground load. In an embodiment, the plurality of bond wires 140 are configured to carry input or output or both types of signals between the package base 120 and the die 130. Although, it is understood that in some applications a few of the plurality of bond wires 140 may carry the power or ground signals. In the depicted embodiment, four sets of bond wires are shown along a periphery of the die. The plurality of bond wires 140 are coupled to corresponding bond pads on the package base 120. The dimensions of the center pad 112 are configured to be smaller than the dimensions of the die 130 to accommodate the plurality of the bond wires 140 along the periphery of the die 130. In addition, the dimensions of the fingers 114 may also be configured to accommodate the plurality of the bond wires 140 as well. Thus, the shape and size of the center pad 110 and the shape and size of the fingers 114 may be adapted to accommodate a particular bond wire layout. In an embodiment, one or more components and materials used to fabricate the semiconductor device 100 are configurable to minimize the inherent or subsequent stress due to thermomechanical mismatch between various components and materials used in the semiconductor device 100. As described earlier, optional plurality of holes 182 may be configured in the connector 110 to reduce stress induced due to thermomechanical property mismatch between the connector 110 and a mold compound. Examples of components may include electrical interconnects between the die 130, the package base 120 and the connector 110, or combination thereof, and examples of materials may include mold compound and substrate. As described earlier, the electrical interconnect includes the connector 110, a plurality of conductive bumps, a conductive pad, a conductive trace, a solder bump, a via, a metal plane, a metal land, a metal plane, a bond wire area, a metal stud, a spring, a socket, and a pin.

Figure 1B:
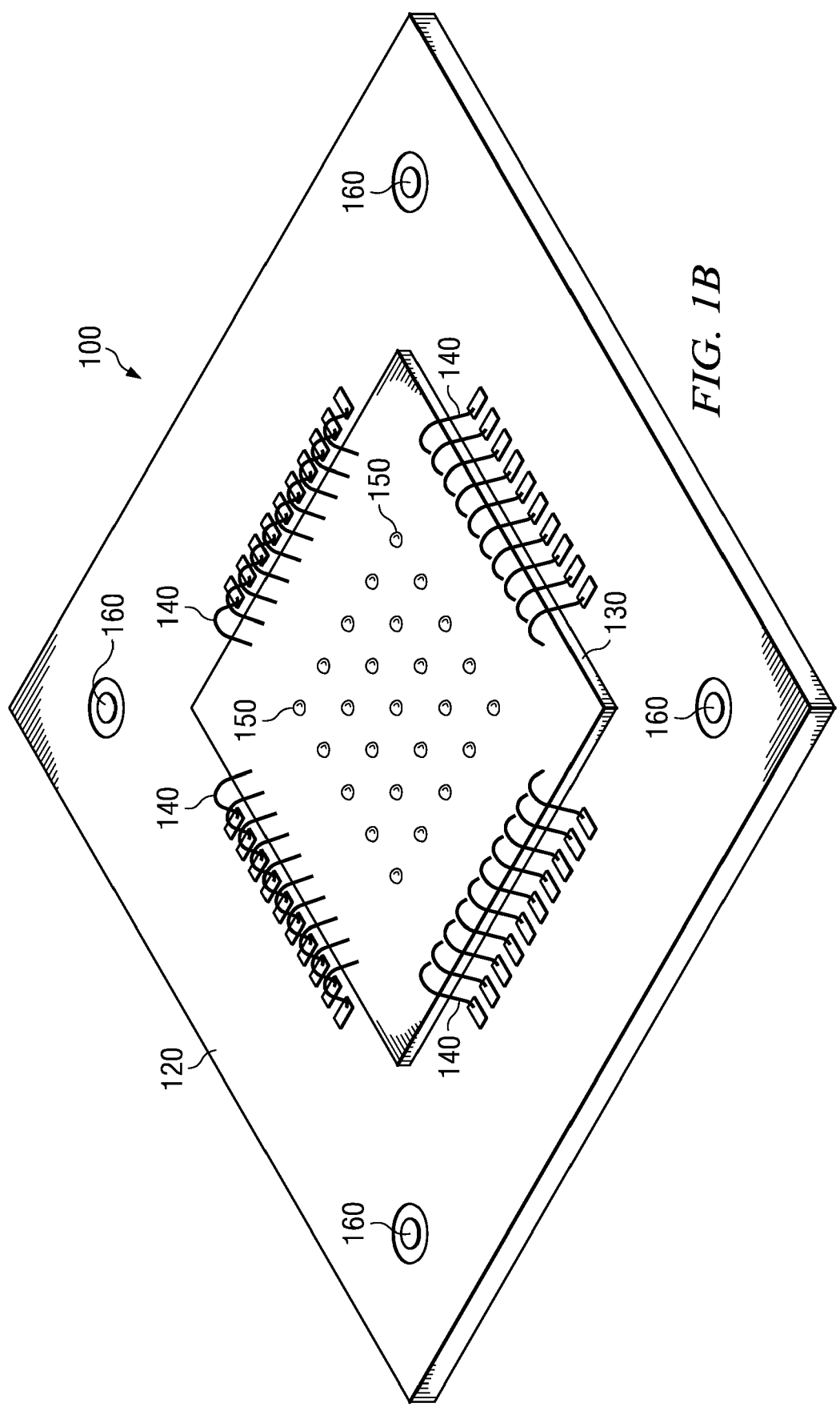
FIG. 1B illustrates a simplified and schematic view in perspective of a package base and a die of a semiconductor device described with reference to FIG. 1A, according to an embodiment.

FIG. 1B illustrates a simplified and schematic view in perspective of the semiconductor device 100 described with reference to FIG. 1A with the connector 110 removed to show details of the package base 120 and the die 130, according to an embodiment. Referring to FIG. 1A and FIG. 1B, a top surface of the die 130 includes a plurality of conductive bumps 150. As described earlier, a conductive bump is a conductive element that may be in the form of a sphere and is included in a conductive path between a die and a substrate. The conductive bump may be formed by applying a reflowable conductive material (such as reflowable solder in a paste, powder, or film form) to a contact pad. A conductive bump may also be implemented in the form of a metal stud. Other materials used to form the conductive bump may include anisotropic or isotropic conductive paste, and copper, gold metals or alloys thereof, or any suitable conductive material. For example, isotropic materials such as isotropic silver filled epoxies offer non-directional or all directional conductivity by incorporating conductive particles such as silver into the adhesive formulation. Isotropic materials may be used on non-solderable substrates or when thermally sensitive chip may be used. Anisotropic conductive polymers enable electrical current to travel along one axis. Anisotropic conductive polymers are widely used in flexible tape substrate applications. A bottom surface of the die 130, which is opposing the top surface, is attached to the package base 120. The plurality of bond wires 140 electrically couple the package base 120 and the die 130.

The package base 120 includes a conductive pad 160 disposed between each corner of the die 130 and a corresponding corner of the package base 120. The conductive pad 160 may be coupled to external circuits (not shown), including the power circuit (not shown) or the ground circuit (not shown), thereby enabling the power and ground circuits to be electrically coupled to the die 130. Use of only four conductive pads reduces number of peripheral bond pads for handling the at least one of power and ground signal, thereby enabling a size reduction in the chip. It is understood that more or less number of conductive pads may be used based on the desired needs of a particular implementation. Each conductive pad 160 of the four conductive pads is aligned with a corresponding one of the finger 114 and uses a printed solder connection. Other connection techniques may use a reflowable conductive material (such as reflowable solder in a paste, powder, or film form) applied to a contact pad. Other materials used to form the conductive pad 160 may include anisotropic or isotropic conductive paste, and copper, gold metals or alloys thereof, or any suitable conductive material. The plurality of conductive bumps 150 provide a direct coupling between the die 130 and a bottom surface of the center pad 112, and the conductive pad 160 provides a direct coupling between the package base 120 and the finger 114. Thus, the connector 110 provides a direct coupling between the die 130 and the package base 120.

As described earlier, the connector 110 may use conductive materials such as metal (e.g., aluminum, copper, silver, gold, and similar others including alloys), a conductive adhesive, a thermo compression weld, a high melting point solder contact, or a combination thereof to achieve the electrical interconnection. The connector 110 may include conductive traces, conductive bumps, solder bumps, vias, metal planes, bond wires, metal lands, metal planes, bond wire areas, conductive pads, metal studs, and similar others. In a particular embodiment, the connector 110 is stamped or etched from a metal sheet, similar to a leadframe. The metal sheet may be optionally plated to improve solderability.

A resistance of a conductive path measured between a power source (not shown) and the die 130 via the connector 110 is much smaller than a resistance of a conductive path measured between the power source and the die 130 via any one of the plurality of bond wires 140. The resistance of the conductive path via the connector 110 may be varied by adjusting dimensions of the center pad 112, a thickness of the metal sheet, and width and length of the finger 114 of the connector 110. In a particular embodiment, the dimensions of the center pad 112 and a width of the finger 114 is configurable in accordance with desired performance parameters such as desirable IR drop, a maximum current load of the die 130, a rated maximum value of the power or ground signal, and a maximum average value of the power or ground current signals. In a particular embodiment, the width of the finger 114 is configured to be approximately between 4 times to 40 times a radius of any one of the plurality of bond wires 140. In an embodiment, the ratio of the resistance of the conductive path via the connector 110 to the resistance of the conductive path via any one of the plurality of bond wires 140 may be adjustable between 1 and 150. Thus, the improved connector advantageously provides a low resistance conductive path, thereby reducing the IR drop, and is also capable of carrying an increased current flow, especially compared to the bond wire path.

Figure 1C:
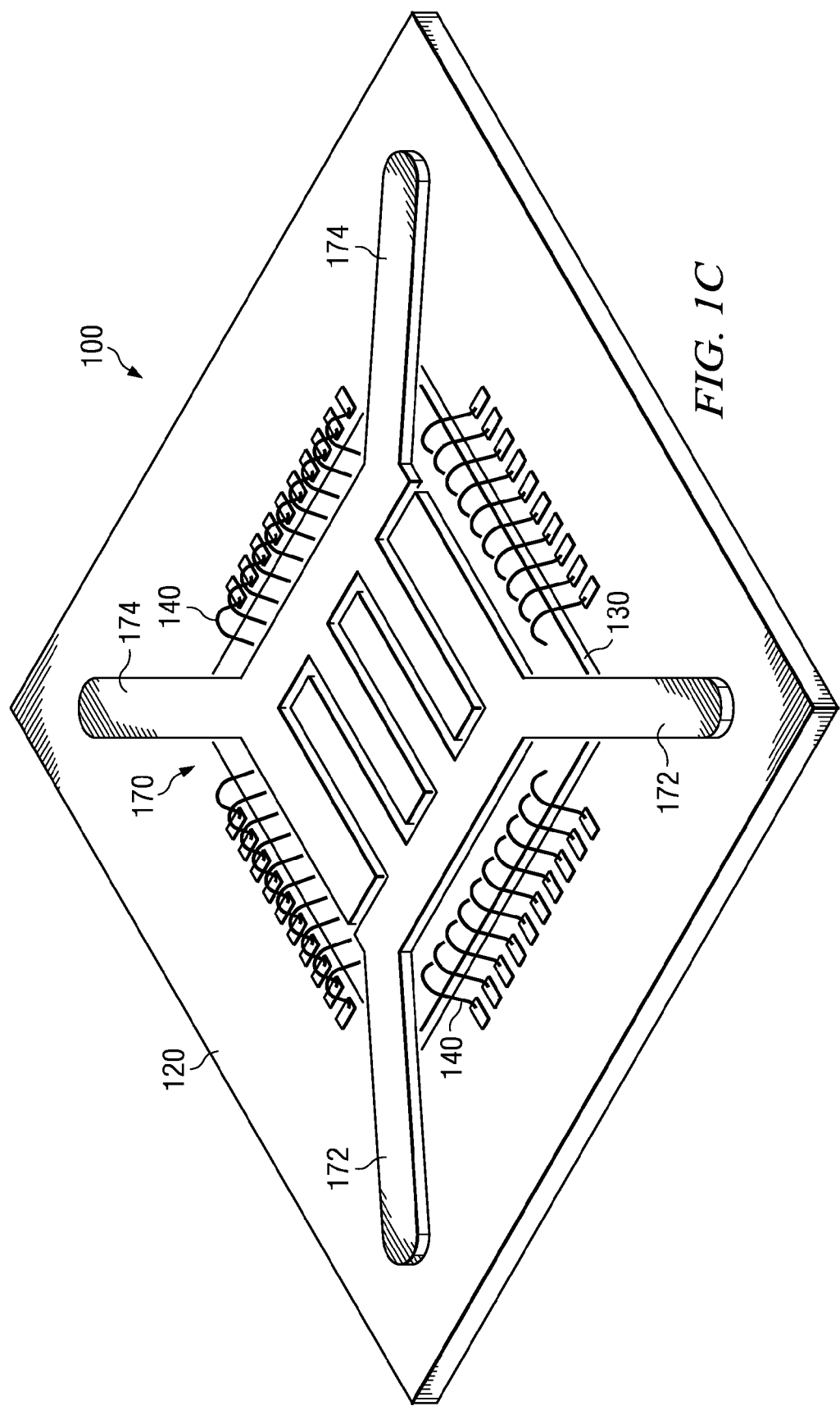
FIG. 1C illustrates a simplified and schematic view in perspective of a semiconductor device having a partitioned connector, according to an embodiment.
Figure 1D:
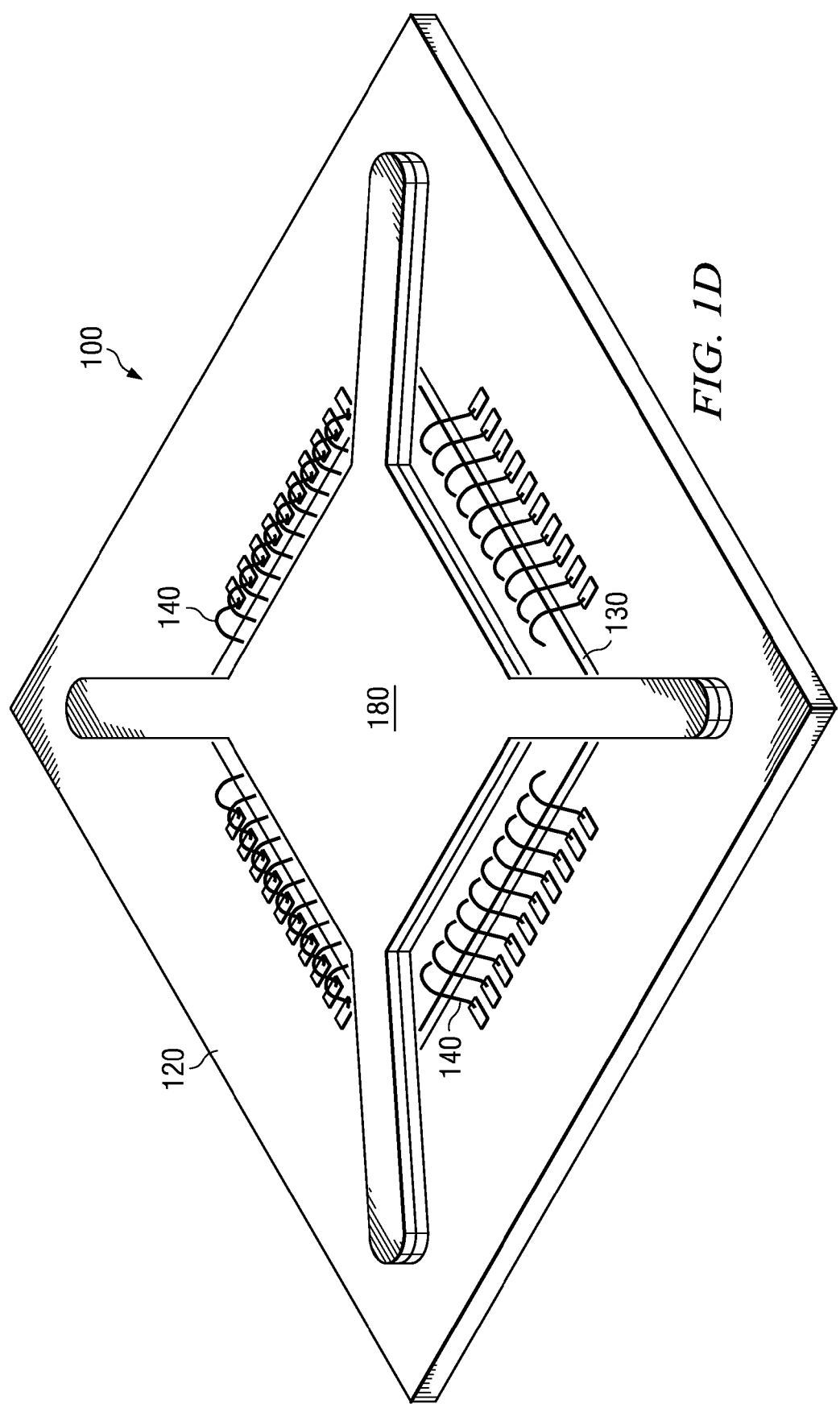
FIG. 1D illustrates a simplified and schematic view in perspective of a semiconductor device having a multilayered substrate connector, according to an embodiment.

The connector 110 may be implemented in several configurations, including the metal sheet. Additional details of a laminate substrate implementation of the connector 110 is described with reference to FIG. 1D FIG. 1C illustrates a simplified and schematic view in perspective of a semiconductor device 100 having a partitioned connector 170, according to an embodiment. In the depicted embodiment, the center pad 112 described with reference to FIG. 1A is electrically partitioned to form the partitioned connector 170 having a power network 172 and a ground network 174. It is understood that although only one network for power and one network for ground is shown, a plurality of partitioned power and ground networks may be provided. The partitioning may reduce noise by reducing inductance between power and ground networks, and may reduce the number of wire bond connections required to connect all the signals, thereby reducing the die size.

FIG. 1D illustrates a simplified and schematic view in perspective of a semiconductor device 100 having a multilayered substrate connector 180, according to an embodiment. In a particular embodiment, the multilayered substrate connector 180 may be implemented as a multilayer flexible tape substrate. In the depicted embodiment, connector 110 is fabricated as a thin, multilayered substrate having 2 metal layers. One metal layer of the multilayered substrate connector 180 may be configured to carry a power signal, whereas another metal layer the multilayered substrate connector 180 may be configured to carry a ground signal. The separation between power and ground networks may advantageously reduce noise by reducing inductance there between.

FIG. 1E illustrates a simplified and schematic cross sectional view of the semiconductor device 100 described with reference to FIG. 1A, according to an embodiment. The die 130 is attached to the package base 120 by a die attach compound (not shown). The connector 110 is electrically coupled to the die 130 via the plurality of conductive bumps 150 and is electrically coupled to the package base 120 via the conductive pad 160. The plurality of bond wires 140 electrically couple the package base 120 and the die 130. As described earlier, the conductive pad 160 is coupled to vias formed in the package base 120 and to BGA to make connections to the outside including connections to the power supply (not shown) or the ground, thereby providing electrical coupling between the die 130 and the power supply (not shown) or the ground via the connector 110.

FIG. 1F illustrates a simplified and schematic view in perspective of the semiconductor device 100 described with reference to FIG. 1A after assembly, according to an embodiment. In the depicted embodiment, a mold compound 190 is used to mold the die 130 (not shown), the connector 110 (not shown), and the plurality of bond wires 140 (not shown). In an exemplary, non-depicted embodiment, the package base 120 may include a ball grid array (BGA) to make connections to the outside. Thus, the semiconductor device 100 having the connector 110 is manufacturable by using existing materials and processes such as die bump, solder print, and reflow. In an exemplary, non-depicted embodiment, the connector 110 may be exposed from the top for ground connection or for connection to a heat sink.

Figure 2:
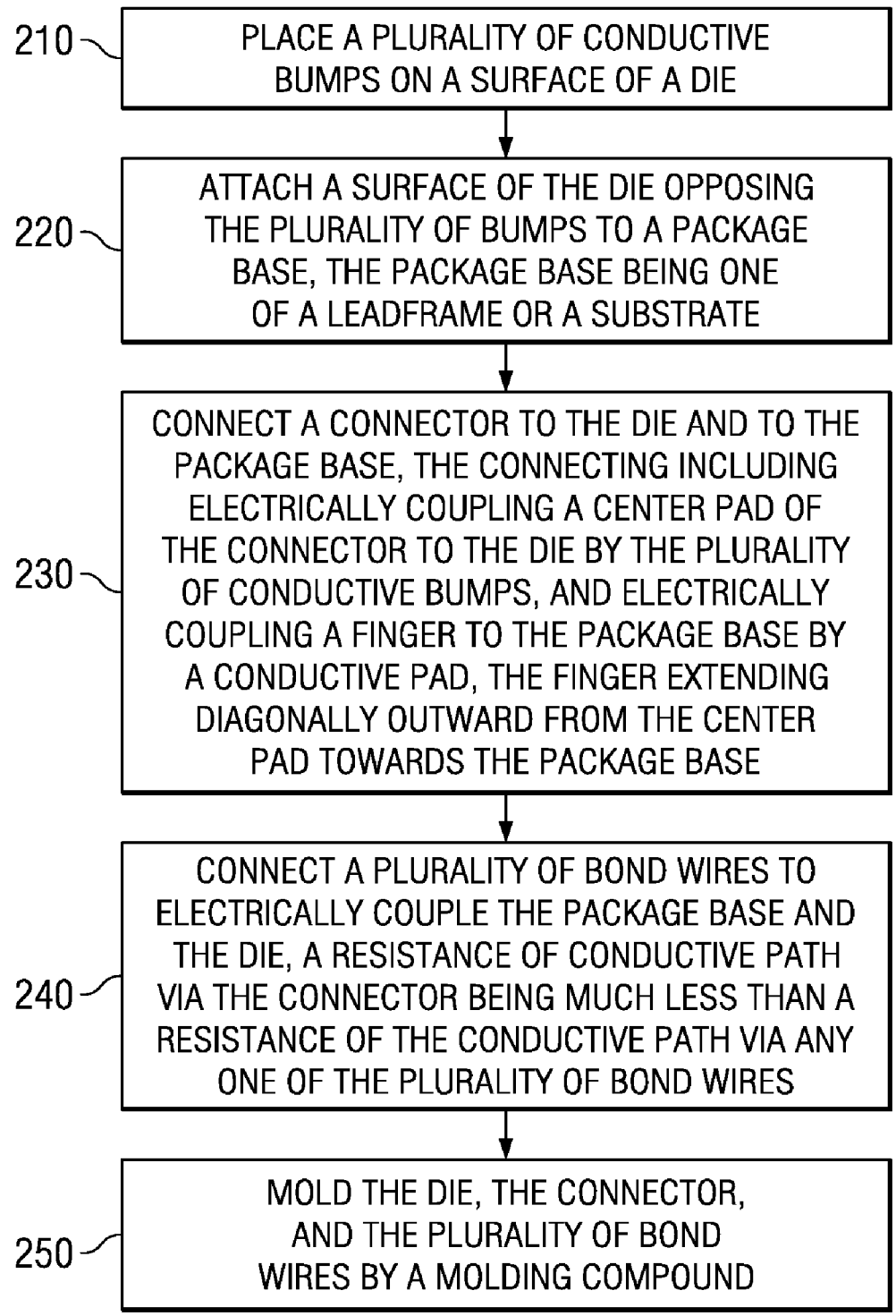
FIG. 2 is a flow chart illustrating a method for fabricating a semiconductor device having an improved connector for handling at least one of power and ground signal, according to an embodiment.

FIG. 2 is a flow chart illustrating a method for fabricating a semiconductor device having an improved connector for handling at least one of power and ground signals, according to an embodiment. In a particular embodiment, FIG. 2 illustrates the process for fabricating the semiconductor device 100 described with reference to FIGS. 1A, 1B, 1C, 1D, 1E and 1F. At step 210, a plurality of conductive bumps are placed on a surface of a die. At step 220, a surface of the die opposing the plurality of bumps is attached to a package base. The package base may be a leadframe or a substrate. At step 230, a connector is connected to the die and to the package base. The connecting step includes electrically coupling a center pad of the connector to the die by the plurality of conductive bumps, and electrically coupling an finger to the package base by a conductive pad. The finger extends outward from the center pad towards peripheral or corner areas of the package base. At step 240, a plurality of bond wires are connected to electrically couple the package base and the die. A resistance of the connector is much less than a resistance of any one of the plurality of bond wires. At step 250, the die, the connector, and the plurality of bond wires are molded over by a molding compound.

Various steps described above may be added, omitted, combined, altered, or performed in different orders. For example, steps 240 and 250 may be interchanged. That is, the step 240 to form the bond wires may be performed before the step 230 to form the connector.

Several advantages are achieved by the method and system according to the illustrative embodiments presented herein. The embodiments advantageously provide an improved connector for transferring at least one of power and ground signals between a die and a package base of a semiconductor device. The improved connector advantageously provides a low resistance conductive path, thereby reducing the IR drop, especially compared to the resistance of the conductive path via the bond wire. The connector, including the finger may be configured to be thicker and wider to decrease the path resistance and increase current flow, and may extend from other sides of the die to enable optimal connection between desired locations on the die and substrate. The electrical coupling between the connector and the die and the package base advantageously provide a direct connection to the die (via the plurality of conductive bumps) to reduce routing on silicon and also reduce the number of peripheral bond pads for power or ground to enable die size reduction. The connector may be optionally implemented as a multilayer substrate to reduce inductance between the power and ground networks, or as a partitioned metal pattern to enable connection of both power and ground. The connector also advantageously provides improvement in thermal performance by providing an additional high-conductivity path between the die and the substrate.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of a die mounted on a substrate, those of ordinary skill in the art will appreciate that the processes disclosed are capable of being used for assembly of semiconductor devices using a leadframe.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for fabricating a semiconductor device, the method comprising:
    placing a plurality of conductive bumps on a first surface of a die;
    attaching a second surface of the die opposing the first surface to a package base;
    connecting a connector, having a center pad and at least four fingers extending diagonally from the center pad, wherein the connecting includes electrically connecting the center pad to the plurality of conductive bumps and in which two fingers are connected to ground terminals on the package base, and two different fingers are connected to power terminals on the package base; and
    connecting a plurality of bond wires to the package base and the first surface of the die, wherein the fingers have an electrical resistance not greater than an electrical resistance of any of the bond wires.

2. The method of claim 1 further comprising molding the die, the connector, and the plurality of bond wires with a molding compound.

3. The method of claim 1 further comprising stamping or etching a metal sheet.

4. The method of claim 1, in which the package base is a leadframe.

5. The method of claim 1, in which the package base is a substrate.

6. A method of for fabricating a semiconductor device, comprising:
    connecting a first die surface and a package base with bond wires;
    connecting the first die surface and a center pad of a connector with conductive bumps;
    connecting the connector and the package base with a plurality of fingers outwardly extended from the center pad, in which two fingers are connected to ground terminals on the package base, and two different fingers are connected to power terminals on the package base.

7. The method of claim 6, in which the package base is a leadframe.

8. The method of claim 6, in which the package base is a substrate.

* * * * *